(12) United States Patent
Cheng et al.

(10) Patent No.: US 9,862,592 B2
(45) Date of Patent: Jan. 9, 2018

(54) MEMS TRANSDUCER AND METHOD FOR MANUFACTURING THE SAME

(71) Applicant: TAIWAN SEMICONDUCTOR MANUFACTURING CO., LTD., Hsinchu (TW)

(72) Inventors: Chun-Ren Cheng, Hsin-Chu (TW); Richard Yen, Hsinchu (TW); Yi-Hsien Chang, Shetou Township (TW); Wei-Cheng Shen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 28 days.

(21) Appl. No.: 14/657,429

(22) Filed: Mar. 13, 2015

(65) Prior Publication Data
US 2016/0264399 A1    Sep. 15, 2016

(51) Int. Cl.
*H01L 29/84* (2006.01)
*B81B 3/00* (2006.01)
*B81C 3/00* (2006.01)

(52) U.S. Cl.
CPC ............ *B81B 3/0021* (2013.01); *B81C 3/001* (2013.01); *B81B 2203/0127* (2013.01)

(58) Field of Classification Search
CPC ...................... B81B 2201/0257; G01L 9/0042
USPC ........................................................ 257/416
See application file for complete search history.

(56) References Cited

U.S. PATENT DOCUMENTS

| | | | | | |
|---|---|---|---|---|---|
| 4,381,469 A | * | 4/1983 | Ogawa | ............... | H03H 9/02102 257/416 |
| 4,539,554 A | * | 9/1985 | Jarvis | ................. | H03K 17/9643 310/311 |
| 4,885,781 A | * | 12/1989 | Seidel | ................... | G01H 11/06 310/324 |
| 5,126,615 A | * | 6/1992 | Takeuchi | .............. | H01L 41/081 310/324 |
| 5,160,870 A | * | 11/1992 | Carson | .................. | B06B 1/0629 310/324 |
| 5,956,292 A | * | 9/1999 | Bernstein | ............... | H04R 17/00 29/25.35 |
| 6,291,927 B1 | * | 9/2001 | Percin | ................. | B05B 17/0607 310/324 |

(Continued)

OTHER PUBLICATIONS

Lu et al., "High Frequency Piezoelectric Micromachined Ultrasonic Transducer Array for Intravascular Ultrasound Imaging", MEMS 2014 (2014) pp. 745-748.*

(Continued)

*Primary Examiner* — Jay C Kim
(74) *Attorney, Agent, or Firm* — Maschoff Brennan

(57) ABSTRACT

A MEMS transducer includes a first substrate and a second substrate facing the first substrate. The first substrate includes a piezoelectric diaphragm and a conductive contact structure. The conductive contact structure is electrically connected to the piezoelectric diaphragm, and protrudes beyond a principal surface of the first substrate. The second substrate includes a conductive receiving feature and an active device. The conductive receiving feature is aligned with and further bonded to the conductive contact structure. The active device is electrically connected to the piezoelectric diaphragm through the conductive receiving feature and the conductive contact structure.

20 Claims, 20 Drawing Sheets

(56) References Cited

U.S. PATENT DOCUMENTS

| | | | | |
|---|---|---|---|---|
| 6,914,367 | B2* | 7/2005 | Furukawa | H03H 3/08 310/313 R |
| 7,148,607 | B2* | 12/2006 | Sato | B06B 1/064 310/328 |
| 7,161,283 | B1* | 1/2007 | Geefay | H03H 3/02 310/348 |
| 7,248,131 | B2* | 7/2007 | Fazzio | B81C 1/00246 257/416 |
| 7,301,260 | B2* | 11/2007 | Kawakubo | H03H 3/02 310/320 |
| 7,353,710 | B2* | 4/2008 | Oikawa | G01L 9/0025 73/703 |
| 7,392,706 | B2* | 7/2008 | Momose | G01L 9/0025 73/706 |
| 7,421,767 | B2* | 9/2008 | Aoki | H03H 9/02992 29/25.35 |
| 7,427,797 | B2* | 9/2008 | Ohguro | B81B 3/0018 257/414 |
| 7,449,821 | B2* | 11/2008 | Dausch | A61B 8/4483 310/322 |
| 7,492,241 | B2* | 2/2009 | Piazza | H03H 3/02 310/321 |
| 7,528,681 | B2* | 5/2009 | Knollenberg | H03H 3/02 257/416 |
| 7,538,401 | B2* | 5/2009 | Eriksen | C23C 14/021 257/419 |
| 7,540,199 | B2* | 6/2009 | Fujii | B81B 7/02 324/661 |
| 7,615,406 | B2* | 11/2009 | Higashi | H01L 23/04 257/690 |
| 7,619,493 | B2* | 11/2009 | Uno | H03H 9/02125 310/335 |
| 7,655,995 | B2* | 2/2010 | Ohguro | H01H 59/0009 257/252 |
| 7,679,153 | B2* | 3/2010 | Ito | H03H 9/0552 257/416 |
| 7,687,833 | B2* | 3/2010 | Marty | H03H 9/0547 257/254 |
| 7,728,487 | B2* | 6/2010 | Adachi | A61B 8/4483 310/309 |
| 7,730,785 | B2* | 6/2010 | Wado | B06B 1/0688 310/311 |
| 7,737,804 | B2* | 6/2010 | Bouche | H03H 3/02 257/415 |
| 7,812,505 | B2* | 10/2010 | Lee | H04R 19/005 216/41 |
| 7,812,692 | B2* | 10/2010 | Ayazi | H03H 3/0076 310/321 |
| 7,825,749 | B2* | 11/2010 | Thalhammer | H03H 3/04 333/133 |
| 7,830,069 | B2* | 11/2010 | Lukacs | B06B 1/0622 310/334 |
| 7,919,814 | B2* | 4/2011 | Goto | B81C 1/00246 257/350 |
| 7,986,075 | B2* | 7/2011 | Asai | H03H 3/02 310/320 |
| 8,040,020 | B2* | 10/2011 | Martin | B81B 7/0058 310/324 |
| 8,081,049 | B2* | 12/2011 | Yoshida | H03H 3/04 29/25.35 |
| 8,283,738 | B2* | 10/2012 | Fujii | B81B 7/007 257/414 |
| 8,309,386 | B2* | 11/2012 | Weigold | H04R 19/005 257/E21.002 |
| 8,330,559 | B2* | 12/2012 | Cheng | B81C 1/00333 333/197 |
| 8,338,899 | B2* | 12/2012 | Tokuda | G01L 9/0042 257/415 |
| 8,378,436 | B2* | 2/2013 | Ezaki | B06B 1/0292 257/416 |
| 8,409,901 | B2* | 4/2013 | El-Gamal | B81C 1/00301 257/E21.575 |
| 8,448,494 | B2* | 5/2013 | Mastromatteo | G01G 3/13 73/23.34 |
| 8,471,643 | B2* | 6/2013 | Kim | H03H 9/2426 331/107 A |
| 8,496,842 | B2* | 7/2013 | Udayakumar | H01L 27/20 216/66 |
| 8,536,764 | B2* | 9/2013 | Pitzer | G01N 29/036 310/326 |
| 8,624,469 | B2* | 1/2014 | Dausch | B06B 1/0622 310/334 |
| 8,692,441 | B2* | 4/2014 | Dausch | B06B 1/0607 216/56 |
| 8,770,035 | B2* | 7/2014 | Yamada | G01L 9/0042 257/415 |
| 8,824,706 | B2* | 9/2014 | Stephanou | C03C 27/08 381/174 |
| 8,922,302 | B2* | 12/2014 | Ruby | H03H 3/04 29/25.35 |
| 9,013,089 | B2* | 4/2015 | Tsai | H03H 3/0072 310/320 |
| 9,029,963 | B2* | 5/2015 | Sparks | G01L 9/008 257/416 |
| 9,049,522 | B2* | 6/2015 | Lee | H04R 17/005 |
| 9,070,861 | B2* | 6/2015 | Bibl | B06B 1/0644 |
| 9,337,802 | B2* | 5/2016 | Hsu | H03H 9/205 |
| 9,608,592 | B2* | 3/2017 | Bi | H03H 9/171 |
| 2003/0199105 | A1 | 10/2003 | Kub | H01L 21/76254 438/3 |
| 2007/0284971 | A1* | 12/2007 | Sano | H03H 9/02094 310/364 |
| 2007/0296008 | A1* | 12/2007 | Natori | H01L 27/105 257/295 |
| 2007/0299345 | A1* | 12/2007 | Adachi | A61B 8/12 600/459 |
| 2008/0111651 | A1* | 5/2008 | Isobe | H03H 3/02 333/187 |
| 2009/0001853 | A1* | 1/2009 | Adachi | A61B 8/4483 310/323.19 |
| 2010/0044808 | A1* | 2/2010 | Dekker | B81C 1/00182 257/415 |
| 2010/0301703 | A1* | 12/2010 | Chen | H03H 9/02007 310/318 |
| 2011/0037813 | A1* | 2/2011 | Nakatani | B41J 2/14233 347/70 |
| 2011/0193916 | A1* | 8/2011 | Hirai | B41J 2/14233 347/71 |
| 2011/0257532 | A1* | 10/2011 | Sasaki | B06B 1/00 600/459 |
| 2012/0319535 | A1* | 12/2012 | Dausch | B06B 1/0622 310/365 |
| 2013/0032906 | A1* | 2/2013 | Ogawa | B81C 1/00658 257/420 |
| 2013/0187246 | A1* | 7/2013 | Adkisson | H03H 9/64 257/416 |
| 2013/0194057 | A1* | 8/2013 | Ruby | H03H 3/02 333/188 |
| 2013/0194353 | A1* | 8/2013 | Hirai | B41J 2/1631 347/71 |
| 2013/0270967 | A1* | 10/2013 | Dausch | B06B 1/0607 310/365 |
| 2014/0035702 | A1* | 2/2014 | Black | H03H 7/075 333/186 |
| 2015/0298965 | A1* | 10/2015 | Tsai | B81C 1/00182 257/415 |
| 2016/0111625 | A1* | 4/2016 | Nunan | H01L 41/047 310/323.21 |

OTHER PUBLICATIONS

Noworolski et al., "Fabrication of SOI wafers with buried cavities using silicon fusion bonding and electrochemical etchback", Sensors and Actuators A 54 (1996) pp. 709-713.*

* cited by examiner

US 9,862,592 B2

MEMS TRANSDUCER AND METHOD FOR MANUFACTURING THE SAME

BACKGROUND

Micro electrical-mechanical system (MEMS) technique has been identified as one of the most promising technologies for a new generation of industry, and has been widely used in a variety of devices such as accelerators, pressure sensors, inkjet printer heads, optical switches and transducers. MEMS is a technology used to create tiny system that combine mechanical and electrical components. Typically, MEMS have feature sizes ranging from micrometers to millimeters. MEMS devices have the ability to operate and actuate on the micro scale or less, and generate responses on the macro scale as well. MEMS are attractive for many applications because of their small size and weight, which allow systems to be miniaturized. In addition, integrated circuit (IC) processing techniques are utilized to fabricate MEMS device so that many MEMS fabrication technologies allow parallel fabrication of thousands of systems, and that leads to a further reduction in the manufacturing cost and improvement in reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
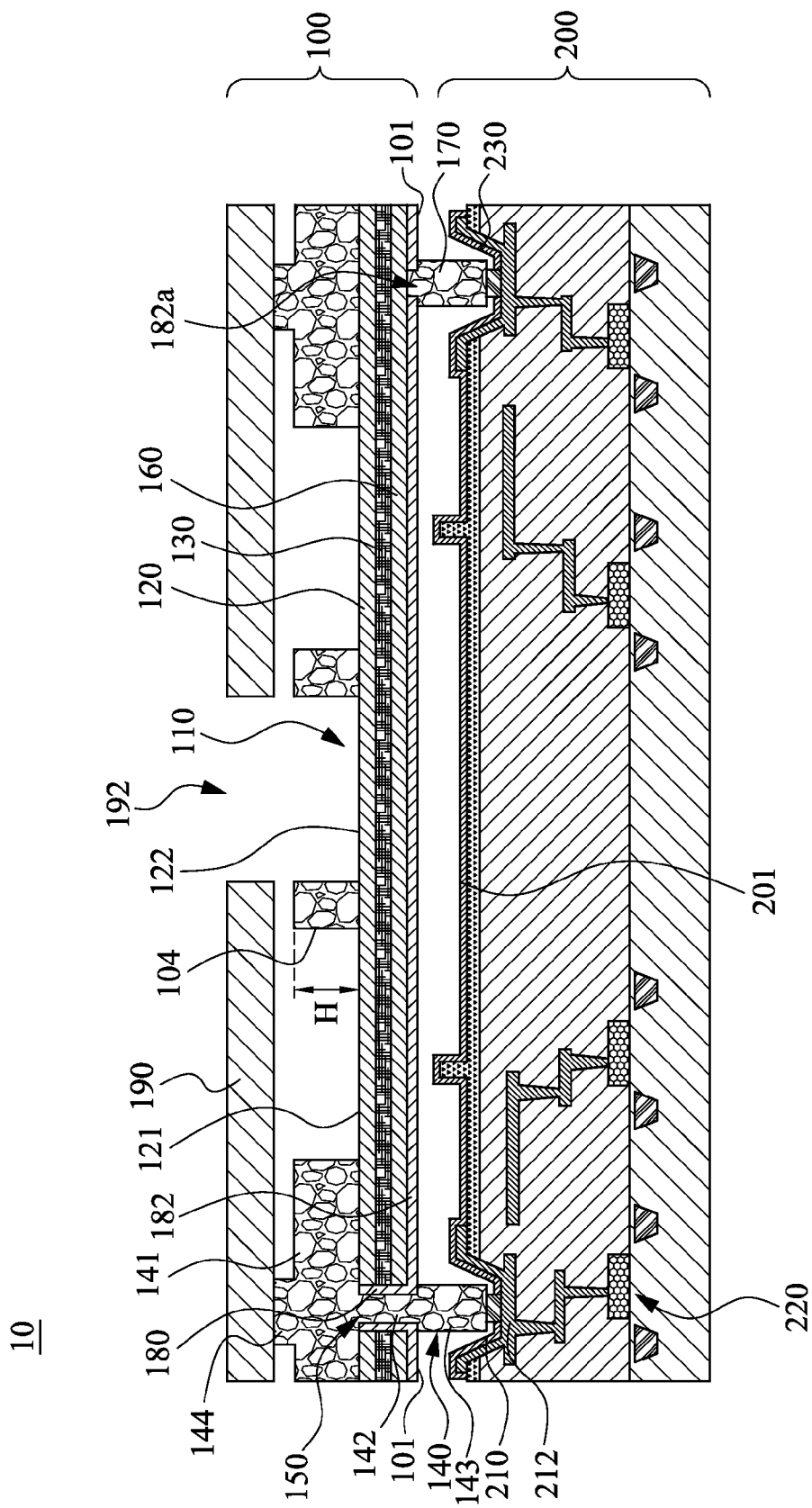
FIG. 1 is a cross-sectional view schematically illustrating a MEMS transducer according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure relates generally to a monolithic micro electrical-mechanical system (MEMS) transducer which transforms an electrical signal to an acoustic signal, and vice versa. The MEMS transducer, for example, may be a microphone or loudspeaker. According to various embodiments of the present disclosure, the monolithic MEMS transducer integrates a piezoelectric substrate and an active substrate into a monolithic assembly. Various embodiments of the present disclosure will be described in detail hereinafter.

FIG. 1 is a cross-sectional view schematically illustrating a MEMS transducer 10 according to various embodiments of the present disclosure. The MEMS transducer 10 includes a first substrate 100 and a second substrate 200 bounded thereto. The first substrate 100 includes a piezoelectric structure 110 and a first conductive contact structure 140 that is electrically connected to the piezoelectric structure 110. The first conductive contact structure 140 protrudes beyond a principal surface 101 of the first substrate 100. The second substrate 200 faces the first substrate 100, and includes a first conductive receiving feature 210 which is aligned with the first conductive contact structure 140 and further bonded to the first conductive contact structure 140. The second substrate 200 further includes a circuit layer having an active electrically connected to the first conductive receiving feature 210. Therefore, the piezoelectric structure 110 is electrically connected to the active device 220 through the first conductive contact structure 140 and the first conductive receiving feature 210.

The piezoelectric structure 110 functions as a diaphragm, and includes a piezoelectric layer 130 and a conductive layer 120 which is in contact with the piezoelectric layer 130. In some embodiments, the piezoelectric layer 130 has a polycrystalline structure with a plurality of grains, and each grain has a substantially hexagonal crystal structure such as a simple hexagonal crystal or hexagonal close-packed (HCP)

crystal. The piezoelectric layer 130 with hexagonal or HCP crystal structure provides a satisfied sensitivity and signal/noise ratio to the MEMS transducer 10 according to some embodiments of the present disclosure. The crystalline morphology of the piezoelectric layer 130 depends upon many parameters such as for example material composition, deposition temperature/pressure/power, and the substrate on which the piezoelectric layer is deposited. Additionally, suitable materials for the piezoelectric layer 130 include, but are not limited to, aluminum nitride (AlN), lead zirconate titanate (PZT), gallium orthophosphate (GaPO$_4$), langasite (La$_3$Ga$_5$SiO$_{14}$), barium titanate, barium titanate (BaTiO$_3$), potassium niobate (KNbO$_3$), lithium niobate (LiNbO$_3$), lithium tantalate (LiTaO$_3$), sodium tungstate (Na2WO$_3$), zinc oxide (ZnO) and the like, and a combination thereof. In some embodiments, the piezoelectric layer 130 is about 0.05 µm to about 2 µm in thickness, specifically about 0.1 µm to about 1.5 µm, more specifically about 0.2 µm to about 1.0 µm.

The conductive layer 120 may be a conductive seeding layer that facilitates the crystalline consistence of the piezoelectric layer 130 according to some embodiments of the present disclosure. In specifics, when depositing the piezoelectric layer 130 on the conductive layer 120, the crystalline morphology of the piezoelectric layer 130 is influenced by the crystal lattice of the conductive layer 120 so that the conductive layer 120 serves as a seeding layer to modulate the crystalline morphology and crystalline consistence of the piezoelectric layer 130. Examples of the material constituting the conductive seeding layer include, but are not limited to, molybdenum (Mo), titanium nitride (TiN), aluminum (Al), platinum (Pt), gold (Au), tungsten (W), and the like, and a combination thereof. The conductive layer 120 further serves as an electrode layer which transfers the electrical potential on the surface of the piezoelectric layer 130 to the first conductive contact structure 140. In some examples, the thickness of the conductive layer 120 may be ranged from about 0.05 µm to about 1 µm, specifically about 0.1 µm to about 0.5 µm, more specifically about 0.1 µm to about 0.2 µm. In yet some embodiments, the conductive layer 120 and the piezoelectric layer 130 have a substantially identical pattern in a plane view of the first substrate 100. For example, the conductive layer 120 and the piezoelectric layer 130 are patterned by using the same mask.

A via 150 may be formed in the piezoelectric structure 110 according to some embodiments of the present disclosure. The via 150 passes through the conductive layer 120 and the piezoelectric layer 130. In some embodiments, an insulating liner 180 may be formed on the sidewall of the via 150. The insulating liner 180 may include a material such as for example silicon oxide, silicon nitride and the like.

An electrode layer 160 may be disposed in the piezoelectric structure 110 such that the piezoelectric layer 130 is disposed between the conductive layer 120 and the electrode layer 160, according to some embodiments of the present disclosure. For example, the electrode layer 160 and the conductive layer 120 may be disposed on opposite sides or opposite surfaces of the piezoelectric layer 130 such that the voltage between the opposite surfaces of the piezoelectric layer 130 may be read out through the electrode layer 160 and the conductive layer 120. In some embodiments, the via 150 passes through the electrode layer 160, the conductive layer 120 and the piezoelectric layer 130, as shown in FIG. 1. In yet some embodiments, the conductive layer 120, the piezoelectric layer 130 and the electrode layer 160 have a substantially identical pattern in a plane view of the first substrate 100. In some examples, the electrode layer 160 and the conductive layer 120 are formed of the same material. For example, the electrode layer 160 may be formed of molybdenum (Mo), titanium nitride (TiN), aluminum (Al), platinum (Pt), gold (Au), tungsten (W), and the like, and a combination thereof. In yet some examples, the thickness of the electrode layer 160 may be ranged from about 0.05 µm to about 1 µm, specifically about 0.1 µm to about 0.5 µm, more specifically about 0.1 µm to about 0.2 µm.

An insulating layer 182 may be formed on the electrode layer 160 of the piezoelectric structure 110 in accordance with some embodiments of the present disclosure. In some examples, the insulating layer 182 extends from the insulating liner 180 and covers the surface of the electrode layer 160. In yet some examples, the insulating layer 182 and the insulating liner 180 are formed of the same material such as for example silicon oxide, silicon nitride and the like. The insulating layer 182 may optionally have an opening 182a exposing a portion of the electrode layer 160.

The first conductive contact structure 140 penetrates the piezoelectric structure 110. In some embodiments, the first conductive contact structure 140 extends into the via 150 from a surface 121 of the conductive layer 120. The first conductive contact structure 140 further protrudes beyond the principal surface 101 of the first substrate 100 and has an end bounded to the first conductive receiving feature 210 of the second substrate 200. In yet some embodiments, the first conductive contact structure 140 includes a first portion 141, a second portion 142 and a third portion 143. The first portion 141 extends in a direction parallel with the conductive layer 120. The second portion 142 is filled in the via 150. The third portion 143 is extended from the second portion 142 and protrudes outwardly beyond the principal surface 101 of the first substrate 100. In some embodiments, the first conductive contact structure 140 further includes a fourth portion 144 standing on the first portion 141, in which the with and thickness of the fourth portion 144 are less than the width and thickness of the first portion 141. In some examples, the thickness of the first portion 141 is about 0.5 µm to about 20 µm, specifically about 1 µm to about 10 µm, more specifically about 2 µm to about 8 µm. In some examples, the thickness of the second portion 142 equals the depth of the via 150, and is ranged from about 0.15 µm to about 4 µm, specifically about 0.2 µm to about 3 µm, more specifically about 0.4 µm to about 2 µm. In yet some examples, the thickness of the third portion 143 is about 0.5 µm to about 20 µm, specifically about 1 µm to about 10 µm, more specifically about 2 µm to about 8 µm. In yet some examples, the thickness of the fourth portion 144 is about 0.05 µm to about 3 µm, specifically about 0.1 µm to about 2 µm, more specifically about 0.2 µm to about 1.5 µm. In examples, the first conductive contact structure 140 may include conductive material such as polycrystalline silicon, TiN, Mo, Al, Pt, W and the like.

A second conductive contact structure 170 may be disposed in the first substrate 100 or on the first substrate 100 according to some embodiments of the present disclosure. The second conductive contact structure 170 is electrically coupled to the electrode layer 160, and protrudes beyond the principal surface 101 of the first substrate 100. In some embodiments, the second conductive contact structure 170 is in contact with the electrode layer 160. For example, as illustrated in FIG. 1, the second conductive contact structure 170 may be disposed at a position overlapped with the opening 182a, and therefore is in contact with the electrode layer 160 through the opening 182a. The second conductive contact structure 170 may include a material the same as the first conductive contact structure 140 according to some embodiments of the present disclosure.

Figure 2:
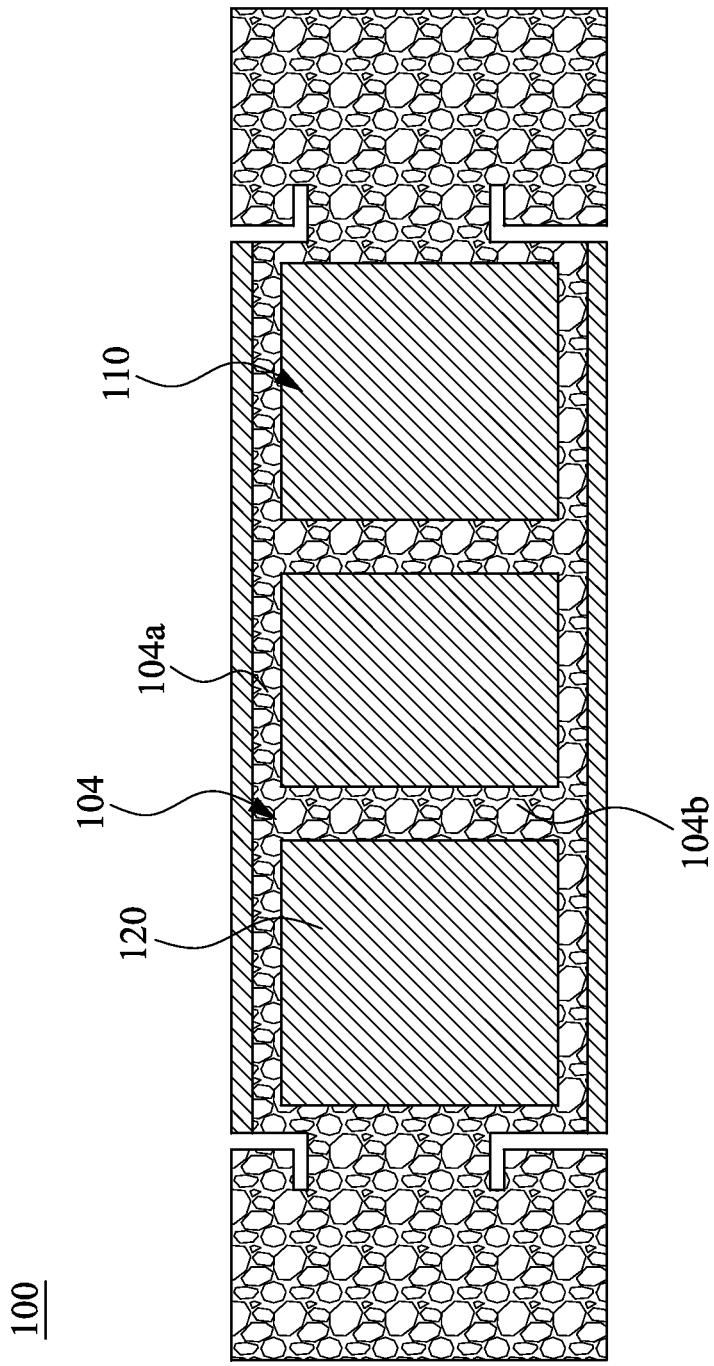
FIG. 2 is a top view schematically illustrating a piezoelectric structure according to some embodiments of the present disclosure.

In the piezoelectric structure 110, a strengthening structure 104 may be optionally provided to increase the mechanical strength of the piezoelectric structure 110. In some embodiments, the strengthening structure 104 is formed above the conductive layer 120, and includes the same material as the first conductive contact structure 140 and/or second conductive contact structure 170. In yet some embodiments, the thickness H of the strengthening structure 104 substantially equals the thickness of the first portion 141 of the first conductive contact structure 140, and ranges from about 0.5 µm to about 20 µm, specifically about 1 µm to about 10 µm. FIG. 2 is a top view schematically illustrating the piezoelectric structure 110 according to some embodiments of the present disclosure. As shown in FIG. 2, the strengthening structure 104 includes a close frame 104a formed on the conductive layer 120. In some examples, the strengthening structure 104 further includes a supporting beam 104b that interconnects between opposite borders of the close frame 104a.

Figure 3:
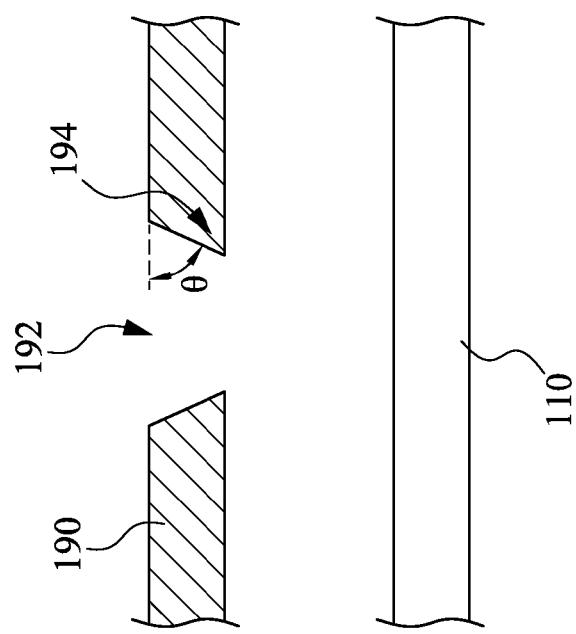
FIG. 3 is cross-sectional views schematically illustrating a cover according to some embodiments of the present disclosure.
Figure 3:
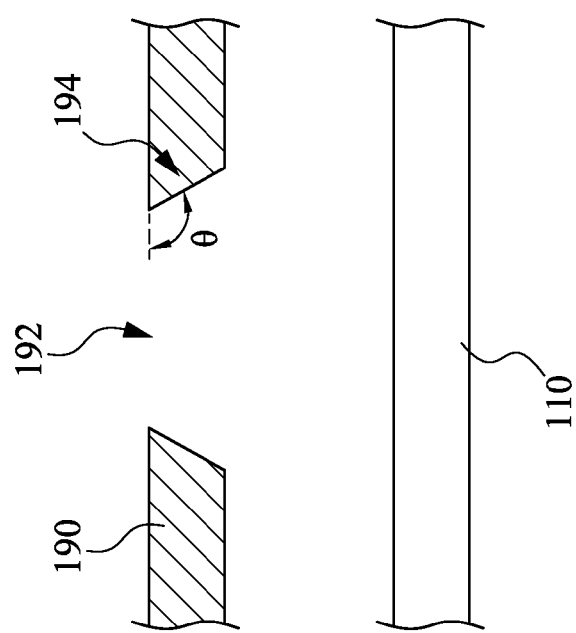

Referring back to FIG. 1, a cover 190 is disposed in the first substrate 100 or on the first substrate 100 according to some embodiments of the present disclosure. The cover 190 has a sound transmitting aperture 192 to expose at least a portion of the piezoelectric structure 110. In some embodiments, a portion 122 of the conductive layer 120 is exposed from the sound transmitting aperture 192. FIG. 3 depicts cross-sectional views of the cover 190 according to some embodiments of the present disclosure. As shown in FIG. 3, the cover 190 has a chamfer portion 194 that defines an edge of the sound transmitting aperture 192. The chamfer portion 194 has a chamfer angle θ ranged from about 30 degrees to about 160 degrees. In some examples, the MENS transducer 10 functions as a microphone, and the chamfer angle θ is ranged from about 110 degrees to 160 degrees, specifically about 120 degrees to 150 degrees, more specifically about 125 degrees to 145 degrees. The cover 190 with the chamfer angle θ may serves as a noise shelter when sound is transmitted through the sound transmitting aperture 192 to the piezoelectric structure 110 from surroundings. On the other hand, in yet some examples, the MENS transducer 10 is a loudspeaker, the chamfer angle θ is ranged from about 30 degrees to 80 degrees, specifically about 40 degrees to 70 degrees, more specifically about 45 degrees to 65 degrees.

Turning back to FIG. 1, the first conductive receiving feature 210 of the second substrate 200 is bonded to the first conductive contact structure 140. Therefore, the conductive layer 120 of the piezoelectric structure 110 may be electrically coupled to the active device 220 through the first conductive receiving feature 210 and the first conductive contact structure 140. In some embodiments, the first conductive receiving feature 210 is recessed relative to a principal surface 201 of the second substrate 200, and has a conductive bottom surface 212 physically connected to the first conductive contact structure 140. Additionally, examples of the active device 220 includes, but are not limited to, complementary metal oxide semiconductor (CMOS) transistors, bipolar junction transistors (BJTs), fin field-effect transistors (FinFETs), and junction field effect transistors (JFETs). In yet some embodiments, the second substrate 200 further includes a second conductive receiving feature 230 that is recessed relative to the principal surface 201, and bonded to the second conductive contact structure 170.

Figure 4:
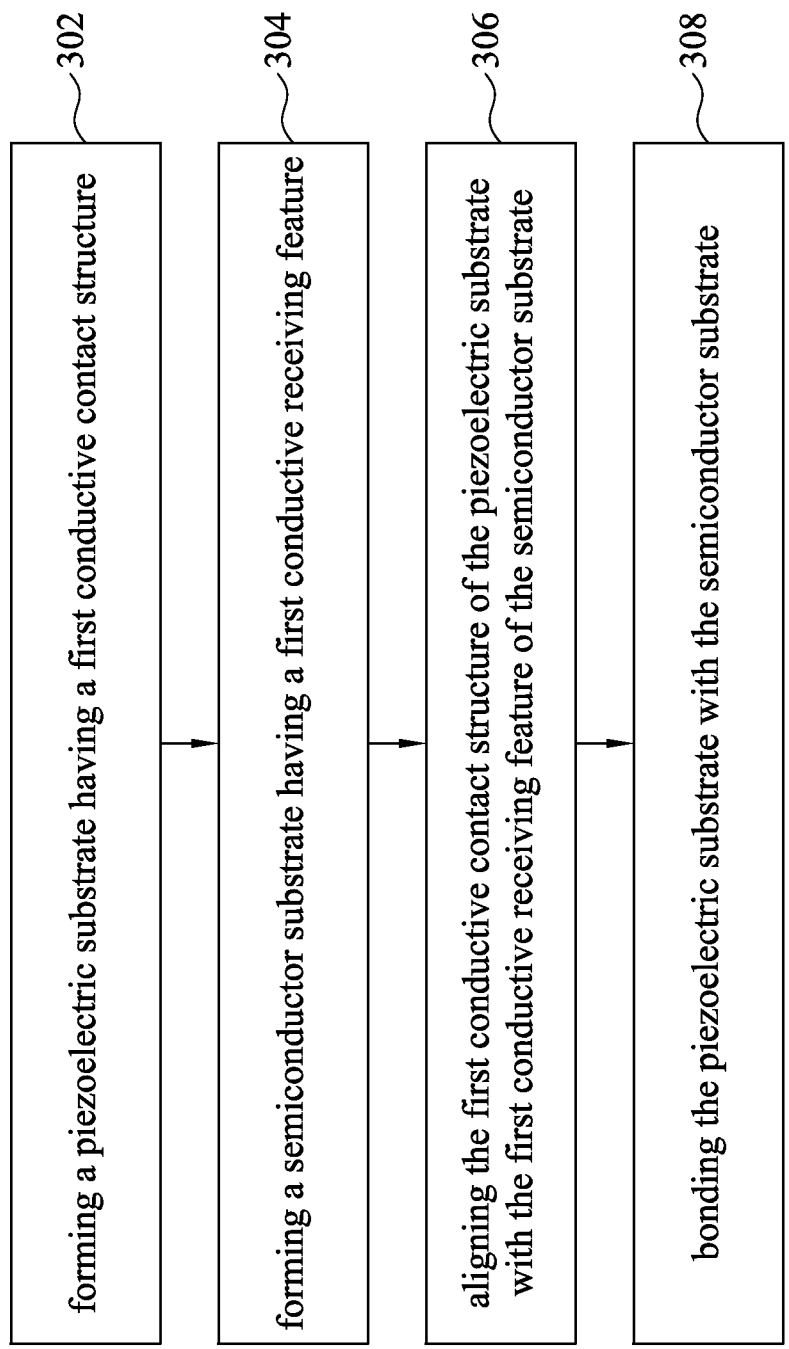
FIG. 4 is a flowchart illustrating a method of manufacturing a MENS transducer according to various embodiments of the present disclosure.

FIG. 4 is a flowchart illustrating a method 300 of manufacturing a MENS transducer according to various embodiments of the present disclosure. The method 300 includes operations 302, 304, 306 and 308. FIGS. 6-20 collectively illustrate a more detailed manufacturing method as a series of cross-sectional views. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 5:
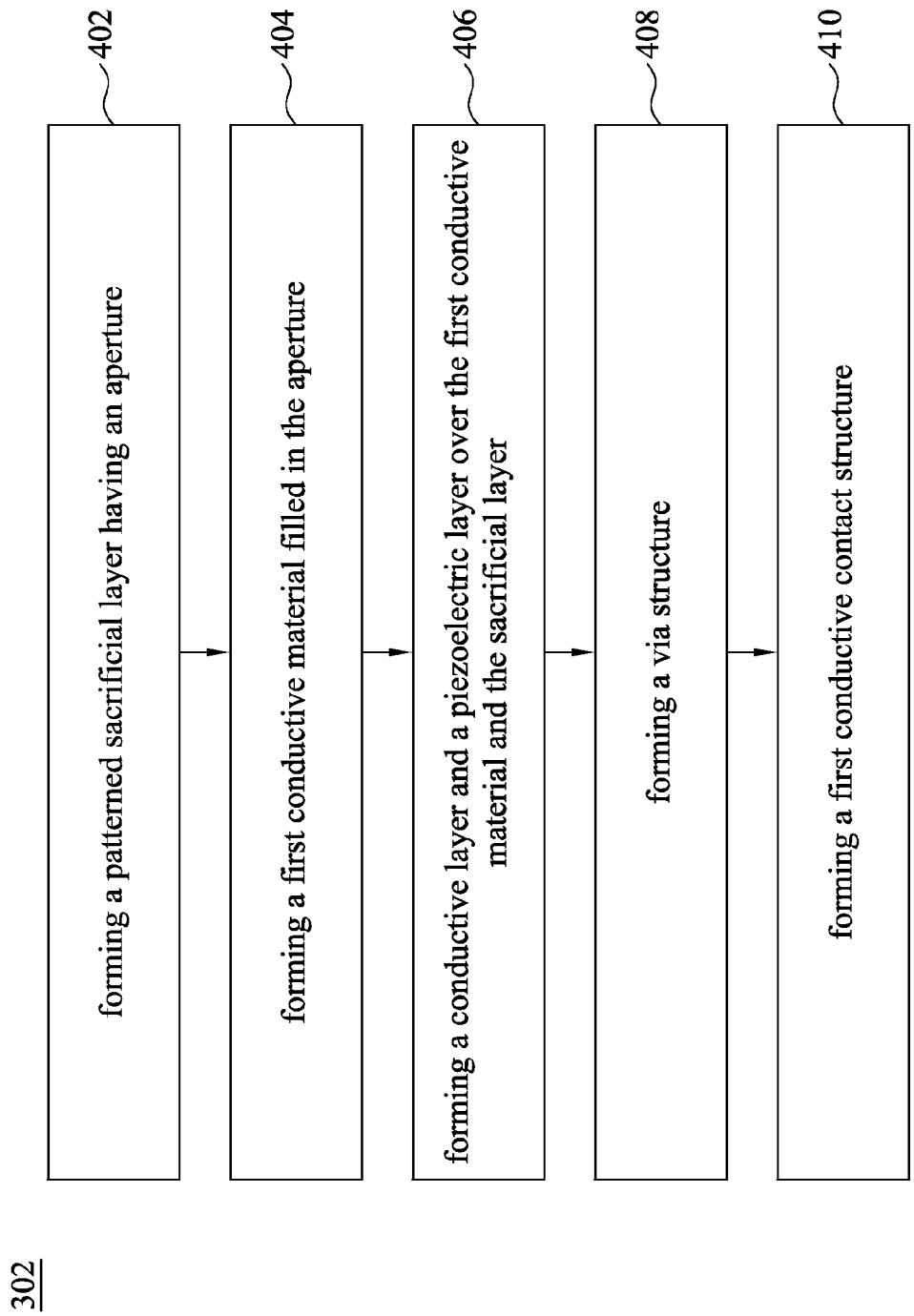
FIG. 5 is a flowchart illustrating an approach to implement the operation 302 of FIG. 4 according to some embodiments of the present disclosure.

Referring to operation 302 of FIG. 4, a piezoelectric substrate having a first conductive contact structure and a piezoelectric structure is formed. FIG. 5 illustrating an approach to implement the operation 302 in a flowchart format according to some embodiments of the present disclosure. As shown in FIG. 5, the operation 302 includes acts 402, 404, 406, 408 and 410. In addition, FIGS. 6-15 depict cross-sectional views at various fabrication stages in the operation 302 according to some embodiments of the present disclosure.

Figure 6:
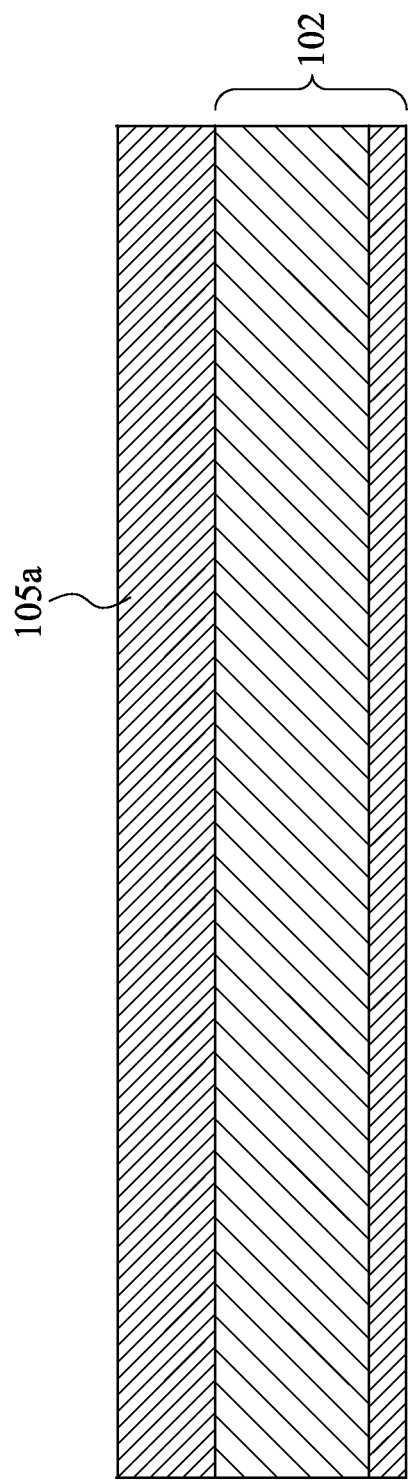
FIGS. 6-20 are schematic cross-sectional views at various stages of fabricating a MENS transducer according to various embodiments of the present disclosure.
Figure 7:
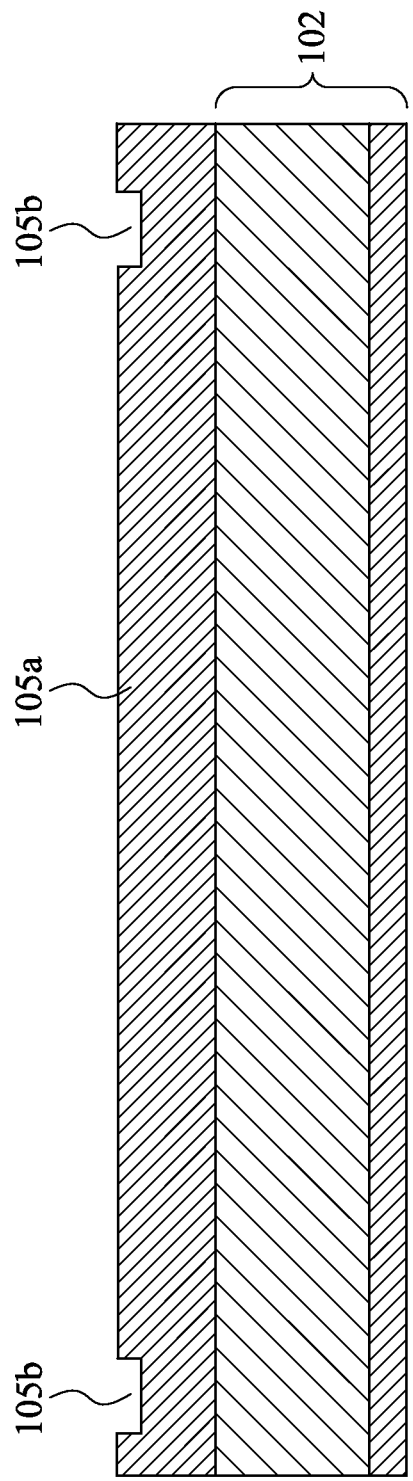
Figure 8:
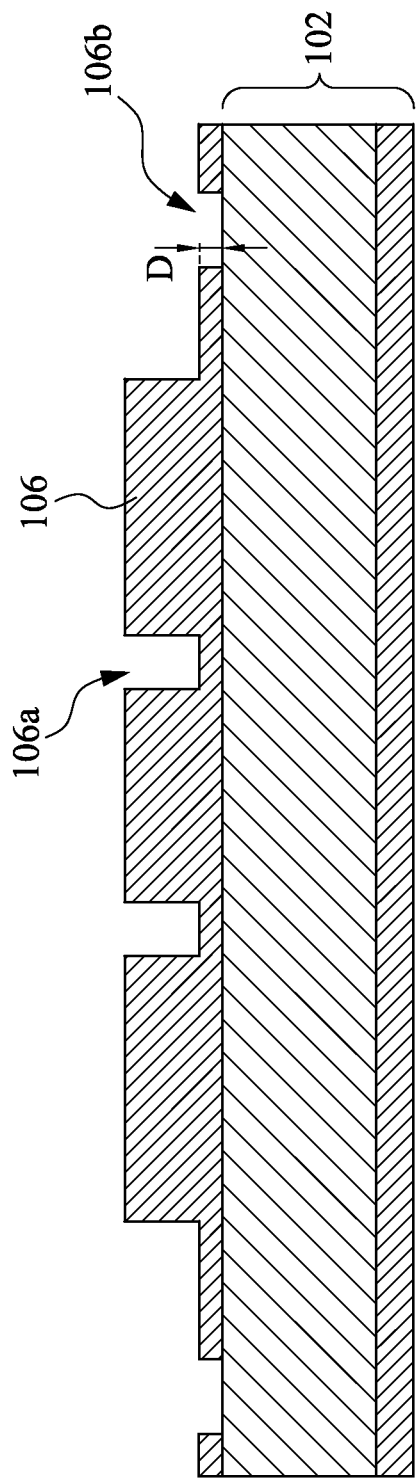

In act 402, a patterned sacrificial layer having a trench is formed over a base substrate, as illustrated in FIGS. 6-8. Referring to FIG. 6, a sacrificial layer 105a is deposited on the base substrate 102. For example, the sacrificial layer 105a may be formed of silicon oxide with a thickness of about 0.5 µm to about 20 µm, specifically 1.0 µm to about 10 µm. In FIG. 7, a first patterning process is carried out to form a trench 105b in the sacrificial layer 105a. In FIG. 8, the sacrificial layer 105a is further etched to be a patterned sacrificial layer 106 having a trench 106a and an aperture 106b. The aperture 106b in FIG. 8 is formed at a position corresponding to the trench 105b in FIG. 7. It is noted that the trench 106a does not pass through the patterned sacrificial layer 106, and the aperture 106b of the patterned sacrificial layer 106 exposes a portion of the base substrate 102. In some examples, the aperture 106b has a depth D of about 0.05 µm to about 3 µm, specifically about 0.1 µm to about 2 µm. In yet some examples, the trench 106a has a depth of about 0.5 µm to about 20 µm, specifically about 1 µm to about 10 µm.

Figure 9:
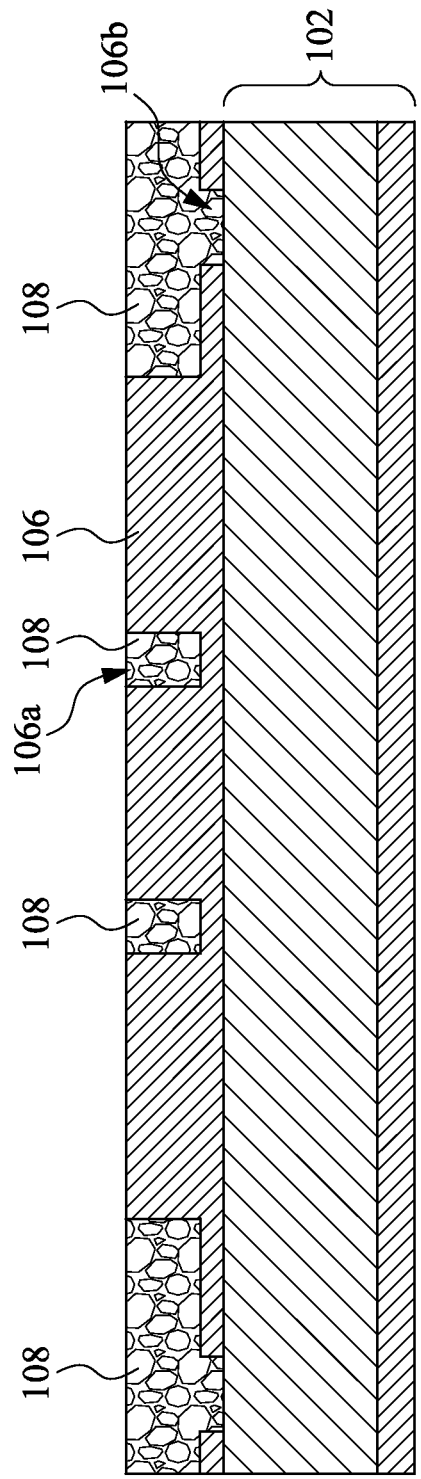

In act 404, a first conductive material 108 is formed to fill the trench 106a and the aperture 106b, as illustrated in FIG. 9. In some embodiments, a layer of conductive material may be deposited on the patterned sacrificial layer 106, and thereafter a chemical-mechanical polishing (CMP) process is carried out so to obtain the first conductive material 108 depicted in FIG. 9. In some examples, the first conductive material 108 has a top surface substantially level with the top surface of the patterned sacrificial layer 106.

Figure 10:
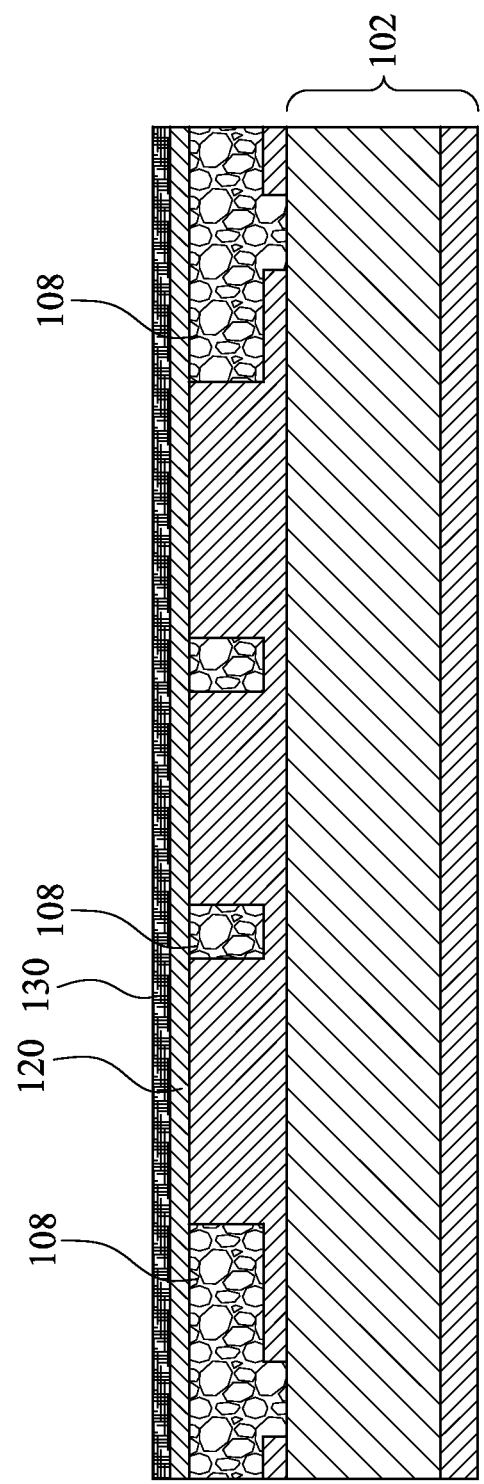
Figure 11:
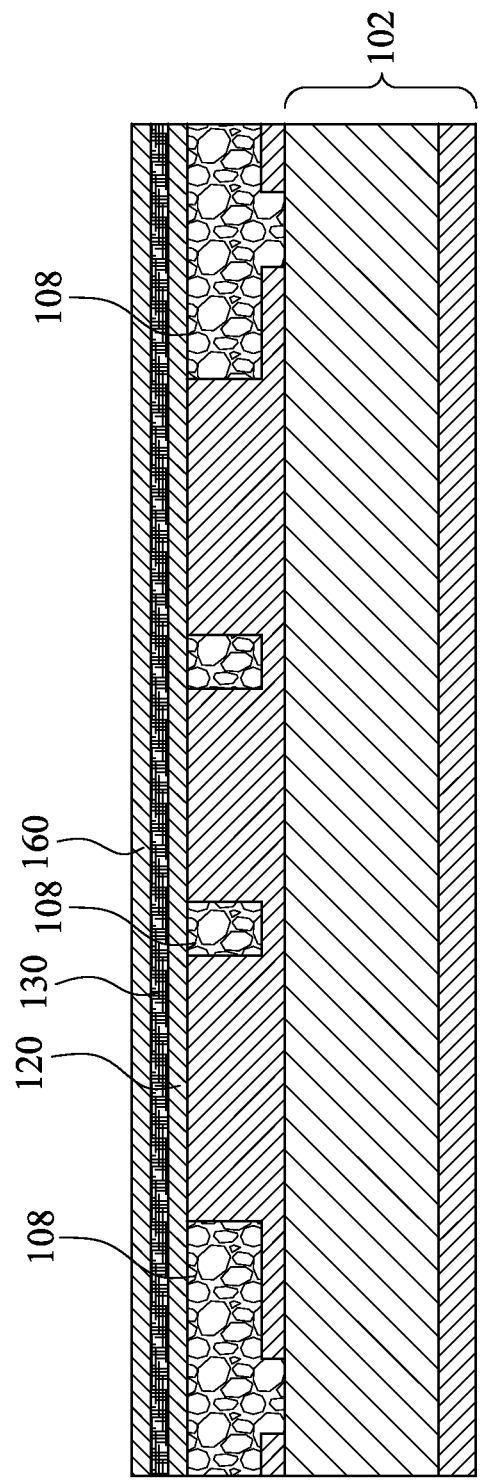

In act 406, a conductive layer 120 and a piezoelectric layer 130 are sequentially formed over the first conductive material 108 and the patterned sacrificial layer 106, as illustrate in FIG. 10. In some embodiments, the conductive layer 120 is formed of molybdenum (Mo), titanium nitride (TiN), aluminum (Al), platinum (Pt), gold (Au), tungsten (W), and the like, and a combination thereof. In examples, the conductive layer 120 may be formed by techniques such as for example sputtering process, atomic layer deposition (ALD), physical vapor deposition (PVD), chemical vapor deposition (CVD), and other suitable approaches. In some embodiments, the piezoelectric layer 130 is formed of aluminum nitride (AlN), lead zirconate titanate (PZT), gallium orthophosphate (GaPO$_4$), langasite (La$_3$Ga$_5$SiO$_{14}$), barium titanate, barium titanate (BaTiO$_3$), potassium niobate (KNbO$_3$), lithium niobate (LiNbO$_3$), lithium tantalate (LiTaO$_3$), sodium tungstate (Na2WO$_3$), zinc oxide (ZnO) and the like, and a combination thereof. In examples, the piezoelectric layer 130 may be formed by techniques such as for example sputtering process, atomic layer deposition (ALD), physical vapor deposition (PVD), chemical vapor deposition (CVD), molecular beam epitaxy (MBE), pulsed laser deposition (PLD) and other suitable approaches. In yet some embodiments, an electrode layer 160 may be formed over the piezoelectric layer 130, as shown in FIG. 11.

Figure 12:
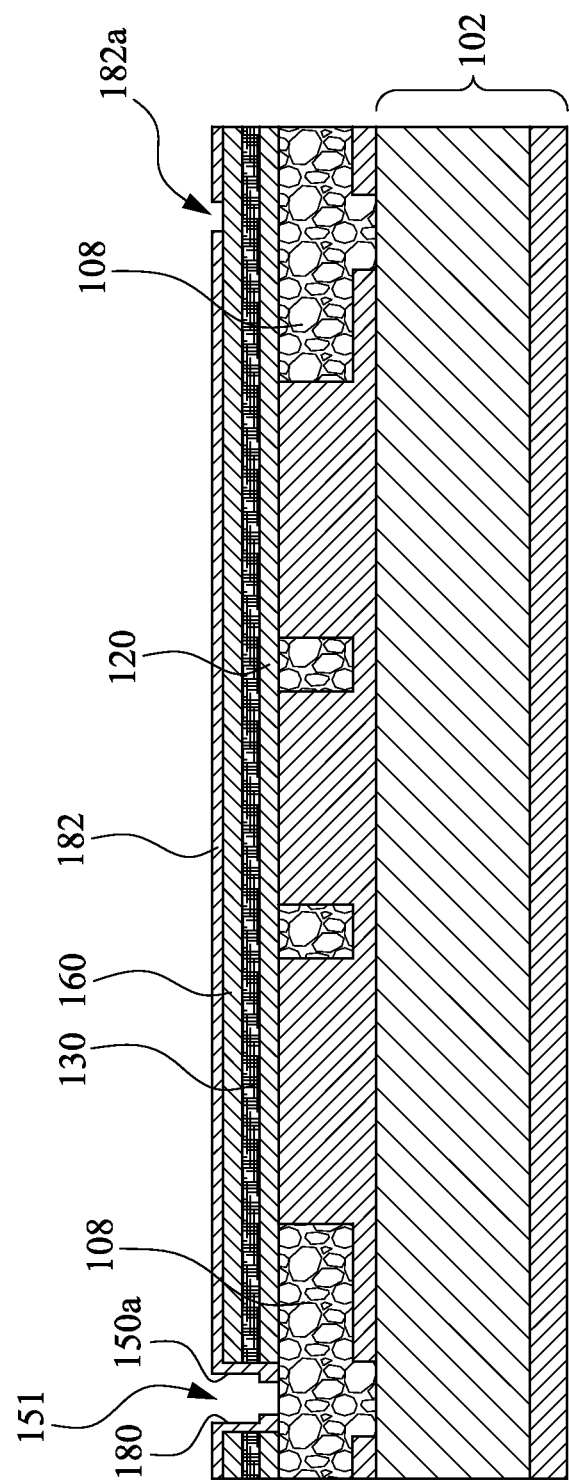

In act 408, a via structure 150a is formed to expose at least a portion of the first conductive material 108, as illustrated in FIG. 12. In some embodiments, an opening 151 is formed through the conductive layer 120, the piezoelectric layer 130 and the electrode layer 160 such that a portion of the first conductive material 108 is exposed. For examples, the opening 151 may be formed by dry etching processes using etchant such as chlorine-based or fluorine-based chemicals, or wet etching processes using etchant such as HCl, H$_2$O$_2$, H$_2$SO$_4$, HNO$_3$ or HCl. Thereafter, an insulating layer 182 is deposited on the electrode layer 160, and on the sidewall and bottom of the opening 151. Subsequently, a portion of the insulating layer 182 on the bottom of the opening 151 is removed so to expose the underlying first conductive material 108. The portion of the insulating layer 182 positioned on the sidewall of the opening 151 serves as an insulating liner 180. In some embodiments, an opening 182a is further formed in the insulating layer 182, and the opening 182a exposes a portion of the electrode layer 160.

Figure 13:
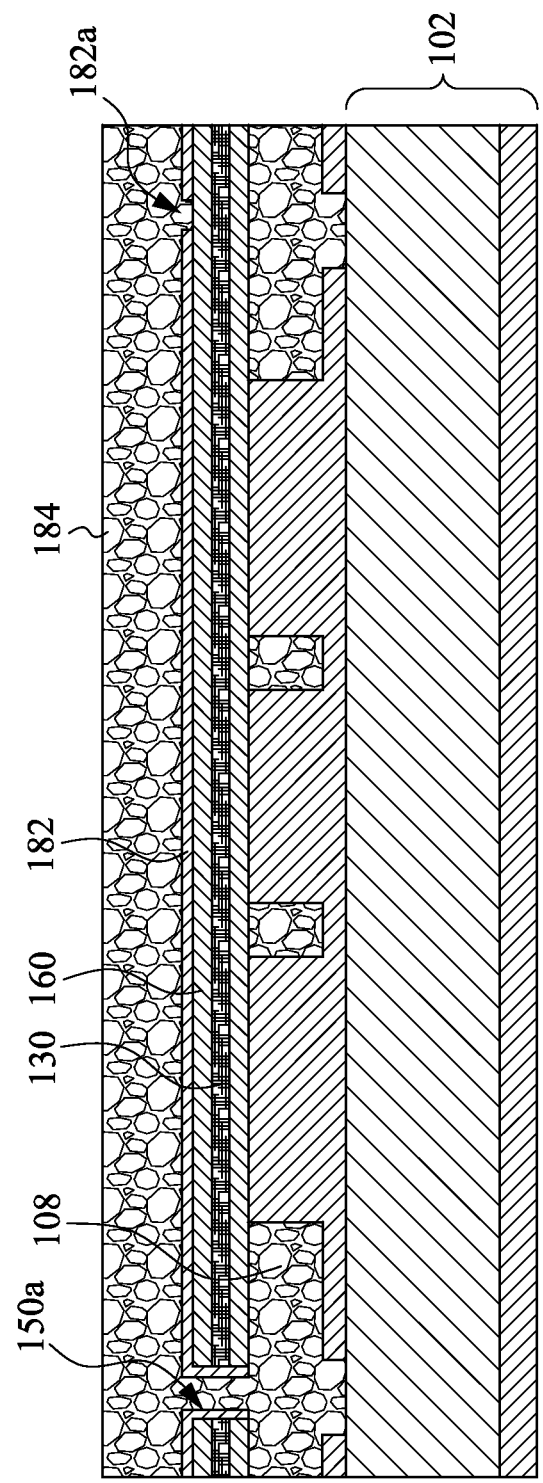
Figure 14:
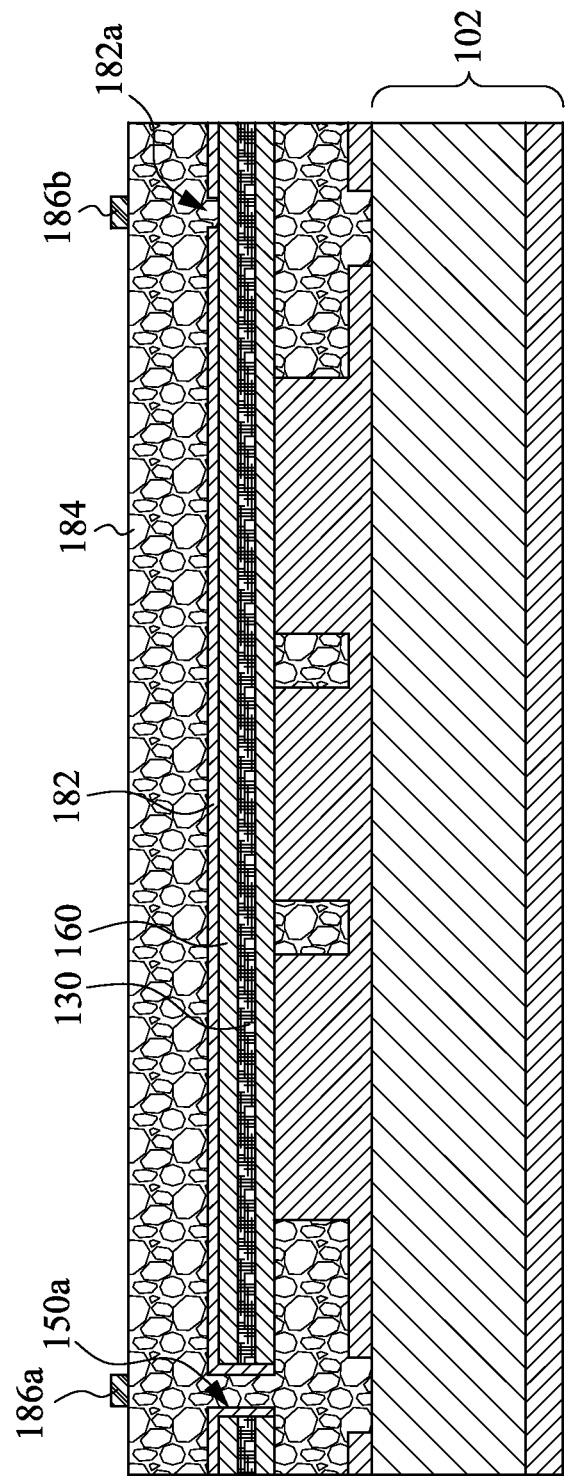
Figure 15:
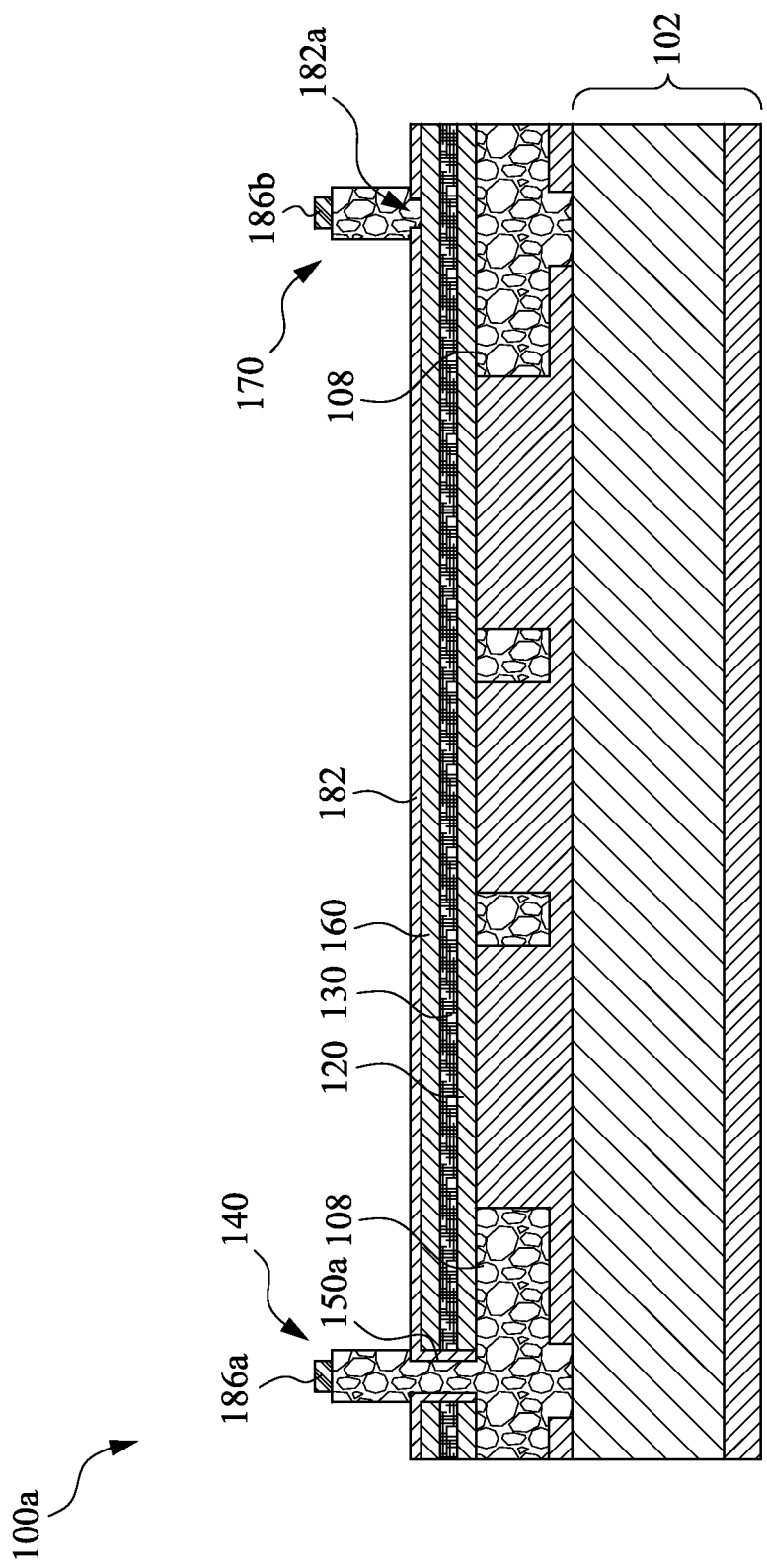

In act 410, a first conductive contact structure 140 is formed, as illustrated in FIGS. 13-15. In various embodiments, a conductive layer 184 is formed on the insulating layer 182 and filled in the via structure 150a and opening 182a, as shown in FIG. 13. In some examples, the conductive layer 184 and the first conductive material 108 are formed of the same material such as for example polycrystalline silicon and the like. Thereafter, as shown in FIG. 14, conductive pads 186a, 186b are formed on the conductive layer 184. The conductive pads 186a, 186b may be formed of germanium (Ge) and the like, for example. The conductive pad 186a is aligned with the via structure 150a whereas the conductive pads 186b is aligned with the opening 182a. Referring to FIG. 15, the conductive layer 184 is patterned to form the first conductive contact structure 140 and the second conductive contact structure 170, and thus a piezoelectric substrate 100a is obtained. The first conductive contact structure 140 is filled in the via structure 150a and extended outwardly beyond an inlet of the via structure 150a.

The acts 402, 404, 406, 408 and 410 illustrated in FIG. 5 provides approaches to implement the operation 302 of forming the piezoelectric substrate 100a, which includes a first conductive contact structure 140 and a piezoelectric structure. The piezoelectric structure includes a conductive layer 120 and a piezoelectric layer 130 in contact with each other. Furthermore, the first conductive contact structure 140 is electrically connected to the piezoelectric structure, and protrudes beyond a principal surface of the piezoelectric substrate 100a.

Figure 16:
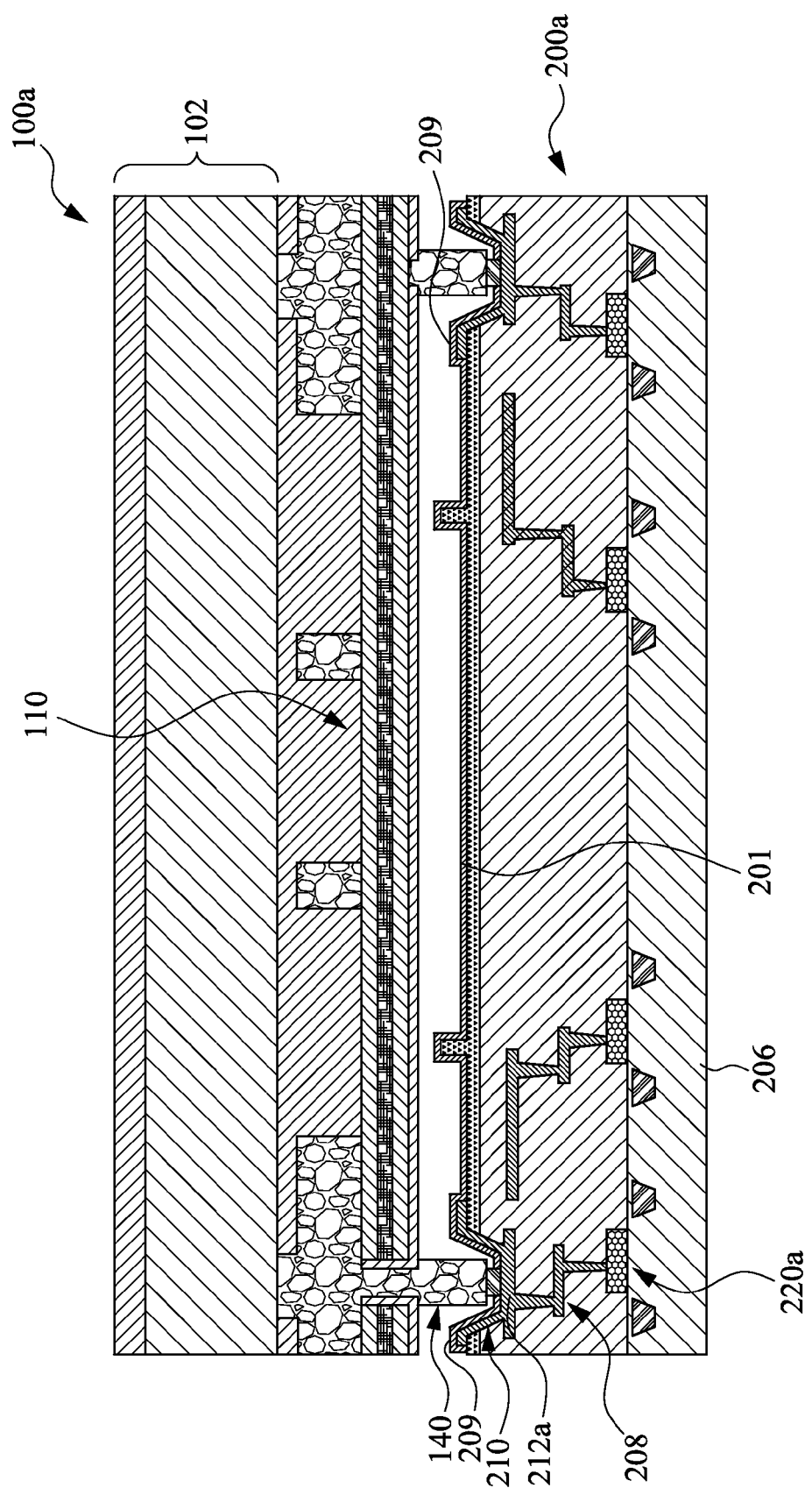

Turning to operation 304 in FIG. 4, a semiconductor substrate having a first conductive receiving feature is formed or provided. There is no specific limitation on the sequence of performing the operation 304 and the operation 302. Particularly, the operation 304 may be performed before or after the operation 302, or the operation 304 and operation 302 may be performed concurrently. Referring to FIG. 16, the semiconductor substrate 200a may be formed through the methods described below in accordance with various embodiments of the present disclosure. One or more semiconductor devices 220a such as for example CMOSs are formed on a substrate 206. Thereafter, interconnecting structures 208 such as for example vias, metal layers and/or inter-metal dielectric (IMD) are formed over the substrate 206 and the semiconductor device 220a, in which the semiconductor device 220a is electrically couple to the interconnecting structures 208. Subsequently, a first conductive receiving feature 210 is fabricated over the interconnecting structures 208. In specifics, one or more pads 212a are formed over the interconnecting structures 208 and electrically coupled to the interconnecting structures 208. It is noted that the pad 212a is formed at a position corresponding to the first conductive contact structure 140 of the piezoelectric substrate 100a. Thereafter, one or more passivation layers 209 are formed over the pads 212a. The passivation layer 209 is provided with an opening exposing a portion of the pads 212a, and thereby obtaining the first conductive receiving feature 210. In examples, the first conductive receiving feature 210 is recessed relative to a principal surface 201 of the semiconductor substrate 200a. Accordingly, the semiconductor substrate 200a is provided with the first conductive receiving feature 210 and the semiconductor device 220a that is electrically connected to the first conductive receiving feature 210.

Referring to operation 306 in FIG. 4, the first conductive contact structure 140 of the piezoelectric substrate 100a is aligned with the first conductive receiving feature 210 of the semiconductor substrate 200a, as illustrated in FIG. 16. In FIG. 16, the piezoelectric substrate 100a has flipped over.

Referring to operation 308 in FIG. 4, the piezoelectric substrate 100a is bounded with the semiconductor substrate 200a, as shown in FIG. 16. In some embodiments, the first conductive receiving feature 210 is bounded to the first conductive contact structure 140. In some examples, a eutectic alloy can be formed on the first conductive receiving feature 210 by electroplating, dual source evaporation, sputtering, or other suitable techniques. Eutectic bonding is capable of producing hermetically sealed packages and electrical interconnection within a single process. In addition, eutectic bonding provides conductive conducts at low processing temperatures, induces low stress in final assembly, and provides high strength bonds with good reliability. In yet some embodiments, the recess of the first conductive receiving feature 210 is used to position the first conductive contact structure 140 proximate to the first conductive receiving feature 210.

Figure 17:
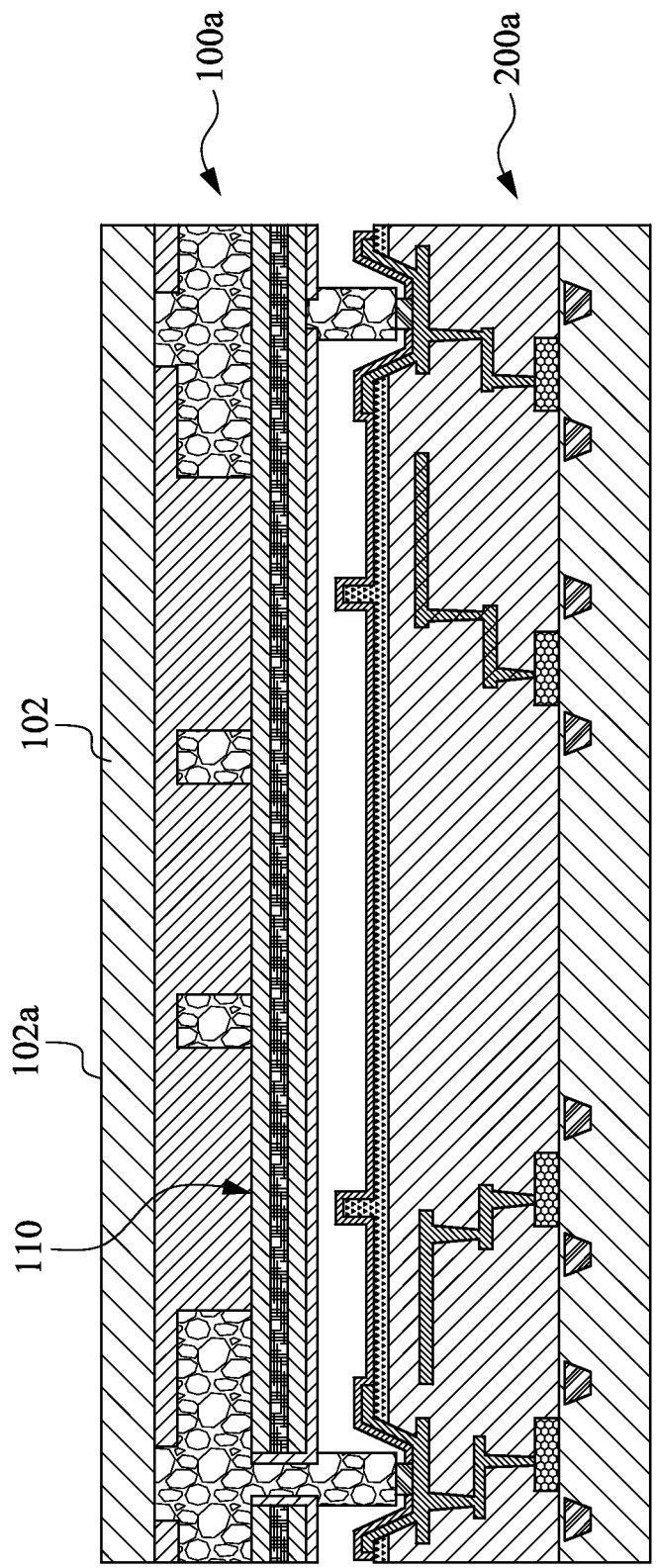
Figure 18:
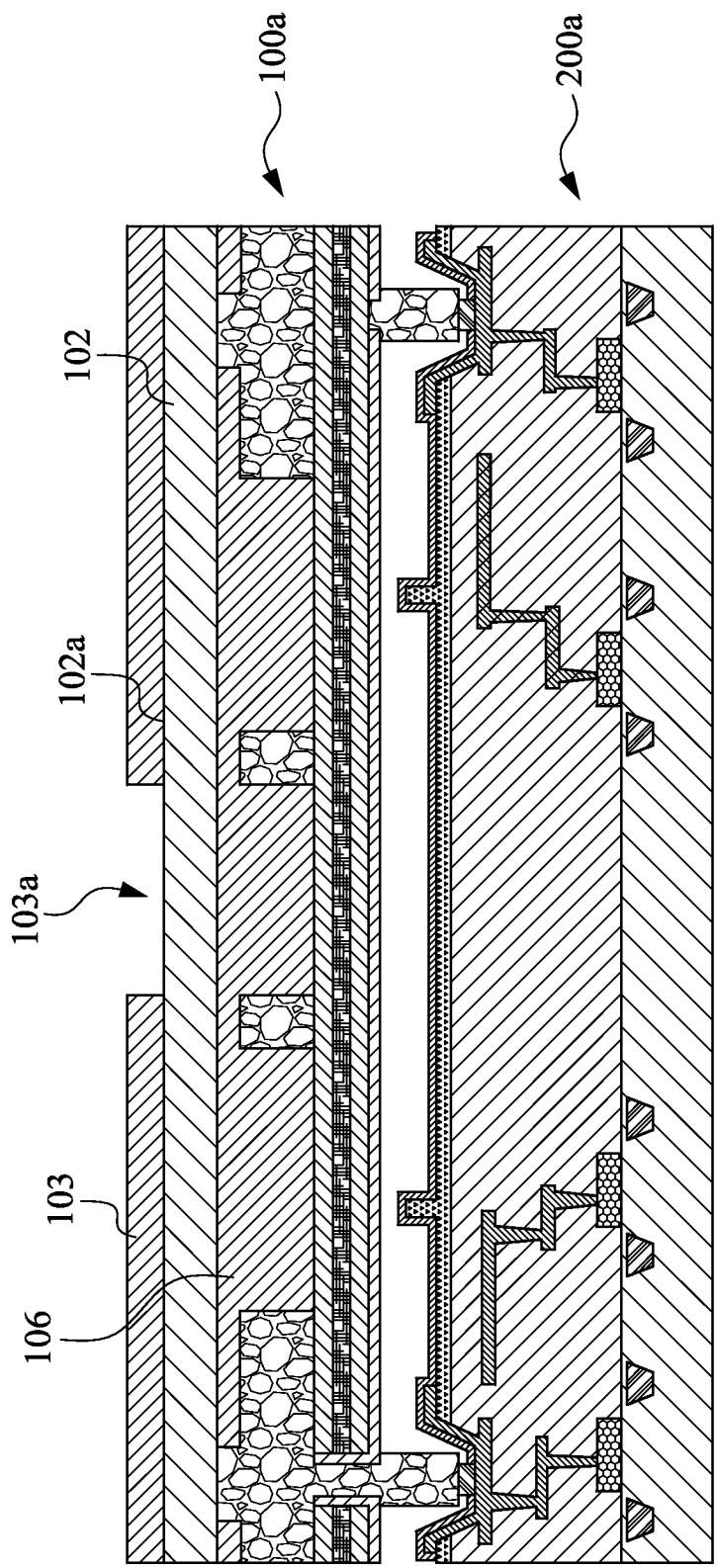
Figure 19:
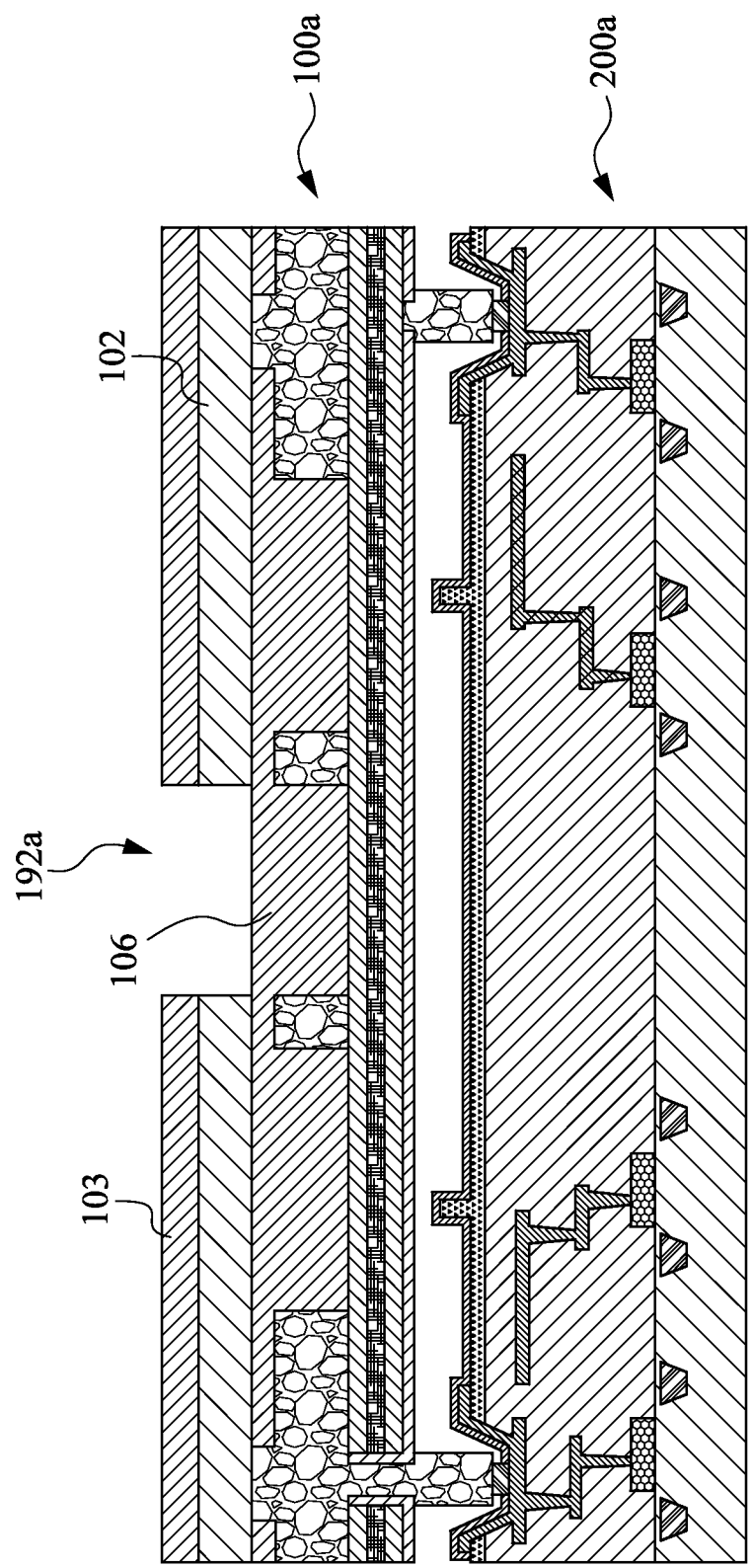
Figure 20:
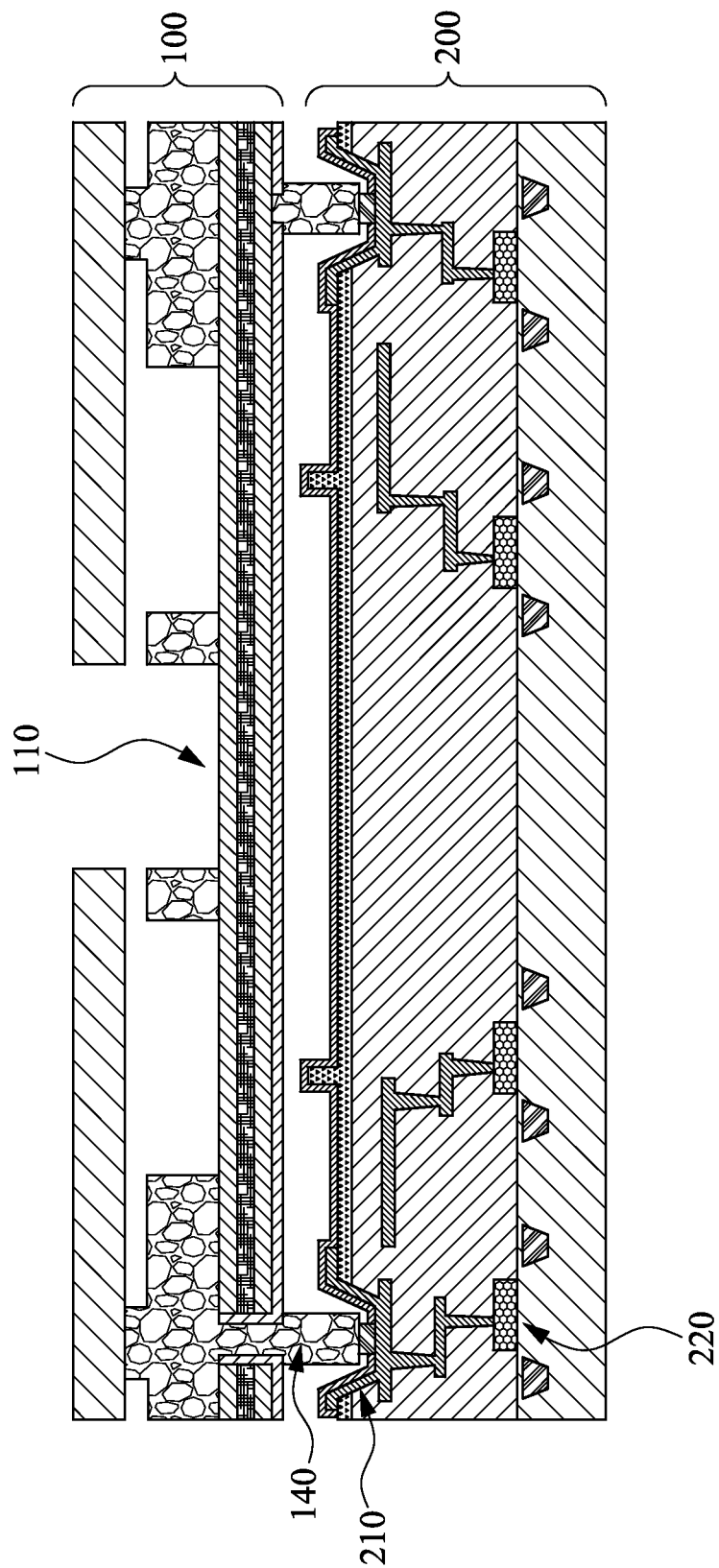

In various embodiments, the method 300 may further include an operation of removing a portion of the piezoelectric substrate to release the piezoelectric structure such that the piezoelectric structure is moveable in response to an acoustic signal or an electrical signal. FIGS. 17-20 depict cross-sectional views at various fabrication stages in the operation of releasing the piezoelectric structure 110 according to some embodiments of the present disclosure. In FIG. 17, a backside 102a of the base substrate 102 of the piezoelectric substrate 100a is thinned. For example, a CMP process may be utilized. In FIG. 18, a patterned mask layer 103 is formed on the backside 102a of the base substrate 102, in which the patterned mask layer 103 has an opening 103a exposing a portion of the base substrate 102. In some embodiments, the patterned mask layer 103 is a hard mask made of the same material as the sacrificial layer 106. In FIG. 19, an etch is carried out to remove a part of the base substrate 102 so as to form an aperture 192a exposing the sacrificial layer 106. In FIG. 20, the patterned mask layer 103 and the sacrificial layer 106 are removed, and thereby releasing the piezoelectric structure 110. For example, liquid or vapor etchant such as hydrofluoric acid may be used to remove the sacrificial layer 106 and the patterned mask layer 103. Although FIGS. 17-20 depict that the operation of releasing the piezoelectric structure 110 is carried out after the operation 308, it is noted that the operation of releasing the piezoelectric structure may be performed prior to the operation 308. In some embodiments, the release operation may be performed after the operation 302 but prior to the operation of 306. In yet some embodiments, the release operation may be involved in the operation 302. For example, after the structure shown in FIG. 15 is obtained, the release operation may be carried out subsequently.

Advantages of various embodiments of the present disclosure include providing a novel monolithic MEMS transducer with a piezoelectric structure, and a novel method for manufacturing the monolithic MEMS transducer. The monolithic MEMS transducer provides an excellent signal/noise ratio and good reliability, has a small area, and is cost effective and compatible to CMOS processes.

In accordance with one aspect of some embodiments, a MEMS transducer includes a first substrate and a second substrate facing the first substrate. The first substrate includes a diaphragm and a conductive contact structure. The diaphragm includes a piezoelectric layer and a conductive layer in contact with the piezoelectric layer. The conductive contact structure is electrically connected to the diaphragm, and protrudes beyond a principal surface of the first substrate. The second substrate includes a conductive receiving feature and an active device. The conductive receiving feature is aligned with and further bonded to the conductive contact structure. The active device is electrically connected to the diaphragm through the conductive receiving feature and the conductive contact structure.

In accordance with another aspect of some embodiments, a semiconductor device includes a MEMS transducer includes a first substrate and a second substrate opposite to the first substrate. The first substrate includes a piezoelectric structure and a conductive contact structure. The piezoelectric structure includes a conductive seeding layer, an electrode layer and a piezoelectric layer disposed between the conductive seeding layer and the electrode layer. The piezoelectric structure has a via passing through the conductive seeding layer, the piezoelectric layer and the electrode layer. The conductive contact structure penetrates the piezoelectric structure through the via, and protrudes beyond a principal surface of the first substrate. The second substrate includes a conductive receiving feature and an active device. The conductive receiving feature is bonded to the conductive contact structure. The active device is electrically coupled to the conductive seeding layer through the conductive receiving feature and the conductive contact structure.

In accordance with another aspect of some embodiments, a method for manufacturing a MEMS transducer is provided. The method includes the following operations: (i) forming a piezoelectric substrate which includes a piezoelectric structure and a conductive contact structure electrically connected to the piezoelectric structure, in which the piezoelectric structure has a conductive layer and a piezoelectric layer in contact with the conductive layer, and the conductive contact structure protrudes beyond a principal surface of the piezoelectric substrate; (ii) forming a semiconductor substrate which includes a conductive receiving feature and a semiconductor device electrically connected thereto; (iii) aligning the conductive contact structure of the piezoelectric substrate with the conductive receiving feature of the semiconductor substrate; and (iv) bonding the piezoelectric substrate with the semiconductor substrate such that the conductive contact structure is in contact with the conductive receiving feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A micro electrical-mechanical system (MEMS) transducer, comprising:
   a first substrate, comprising:
      a piezoelectric structure comprising a conductive seeding layer, an electrode layer, and a piezoelectric layer disposed between the conductive seeding layer and the electrode layer, wherein the piezoelectric structure has a via passing through the conductive seeding layer, the piezoelectric layer, and the electrode layer; and
      a conductive contact structure electrically connected to the piezoelectric structure;
   a cover over the first substrate; and
   a second substrate under the first substrate, the second substrate comprising:
      a conductive receiving feature aligned with and bonded to the conductive contact structure; and
      an active device electrically connected to the conductive seeding layer of the piezoelectric structure through the conductive receiving feature and the conductive contact structure;
   wherein the conductive contact structure comprises:
      a first portion filled in the via;
      a second portion extending from the first portion in the via to the cover over the first substrate; and
      a third portion extending from the first portion in the via to the conductive receiving feature, wherein the first, second, and the third portions comprise an identical conductive material.

2. The MEMS transducer according to claim 1, wherein the conductive seeding layer comprises a material selected from the group consisting of Mo, TiN, Al, Pt, Au, W, and a combination thereof.

3. The MEMS transducer according to claim 1, wherein the piezoelectric layer comprises a plurality of grains and each grain has a hexagonal crystal structure.

4. The MEMS transducer according to claim 1, wherein the piezoelectric layer and the conductive seeding layer have a substantially identical pattern.

5. A micro electrical-mechanical system (MEMS) transducer, comprising:
   a first substrate comprising:
      a piezoelectric structure comprising a conductive seeding layer, an electrode layer, and a piezoelectric layer disposed between the conductive seeding layer and the electrode layer, wherein the piezoelectric structure has a via passing through the conductive seeding layer, the piezoelectric layer, and the electrode layer; and a first conductive contact structure penetrating the piezoelectric structure through the via and protruding beyond a principal surface of the first substrate; and a second substrate opposite to the first substrate, the second substrate comprising:

a first conductive receiving feature bonded to the first conductive contact structure; and an active device electrically coupled to the conductive seeding layer through the first conductive receiving feature and the first conductive contact structure.

6. The MEMS transducer according to claim 5, wherein the first substrate further comprises a second conductive contact structure electrically coupled to the electrode layer and protruding beyond the principal surface of the first substrate.

7. The MEMS transducer according to claim 6, wherein the second substrate further comprises a second conductive receiving feature formed on a principal surface of the second substrate and bonded to the second conductive contact structure.

8. The MEMS transducer according to claim 5, wherein the first conductive contact structure extends from a surface of the conductive seeding layer through the via to the first conductive receiving feature.

9. The MEMS transducer according to claim 5, wherein the first substrate further comprises an insulating liner in the via.

10. The MEMS transducer according to claim 5, wherein the first substrate further comprises a cover having a sound transmitting aperture exposing a portion of the conductive seeding layer.

11. The MEMS transducer according to claim 10, wherein the cover has a chamfer portion that defines an edge of the sound transmitting aperture, and the chamfer portion has a chamfer angle θ of about 50 degrees to about 130 degrees.

12. The MEMS transducer according to claim 5, wherein the piezoelectric structure further comprises a strengthening structure positioned on the conductive seeding layer, wherein the strengthening structure comprises a material the same as the first conductive contact structure.

13. The MEMS transducer according to claim 12, wherein the strengthening structure has a thickness ranged from about 1 μm to about 10 μm.

14. The MEMS transducer according to claim 13, wherein the strengthening structure forms a close frame on the conductive seeding layer.

15. The MEMS transducer according to claim 5, wherein the first conductive receiving feature is recessed relative to a principal surface of the second substrate and has a conductive bottom surface connected to the first conductive contact structure.

16. The MEMS transducer according to claim 5, wherein the conductive seeding layer comprises a material selected from the group consisting of molybdenum (Mo), titanium nitride (TiN), aluminum (Al), platinum (Pt), gold (Au), tungsten (W), and a combination thereof.

17. The MEMS transducer according to claim 5, wherein the conductive seeding layer, the piezoelectric layer, and the electrode layer have a substantially identical pattern in a plane view of the first substrate.

18. The MEMS transducer according to claim 5, wherein the electrode layer and the conductive seeding layer are made of a same material.

19. The MEMS transducer according to claim 5, wherein the first conductive contact structure comprises:

a first portion in contact with the conductive seeding layer and extending in a direction parallel with the conductive seeding layer;

a second portion filled in the via; and a third portion extending from the second portion to the first conductive receiving feature.

20. The MEMS transducer according to claim 5, wherein the piezoelectric layer comprises a plurality of grains and each grain has a hexagonal crystal structure.

* * * * *